(12) United States Patent
Coolidge et al.

(10) Patent No.: US 7,948,225 B2
(45) Date of Patent: May 24, 2011

(54) PHASE IDENTIFICATION SYSTEMS AND METHODS

(75) Inventors: Aaron Coolidge, Marlborough, MA (US); Harold I. Marsden, Westborough, MA (US)

(73) Assignee: Power Systems Integrity, Inc., Northborough, MA (US)

( * ) Notice: Subject to any disclaimer, the term of this patent is extended or adjusted under 35 U.S.C. 154(b) by 626 days.

(21) Appl. No.: 12/119,274

(22) Filed: May 12, 2008

(65) Prior Publication Data
US 2008/0265864 A1 Oct. 30, 2008

Related U.S. Application Data

(63) Continuation-in-part of application No. 11/281,959, filed on Nov. 17, 2005, now Pat. No. 7,372,246.

(60) Provisional application No. 60/629,025, filed on Nov. 18, 2004.

(51) Int. Cl.
*G01R 19/00* (2006.01)

(52) U.S. Cl. .......................................... 324/66

(58) Field of Classification Search ................. 324/66
See application file for complete search history.

(56) References Cited

U.S. PATENT DOCUMENTS

| 5,473,244 | A | 12/1995 | Libove et al. |
| 6,642,700 | B2 | 11/2003 | Slade et al. |
| 6,667,610 | B2 * | 12/2003 | Piesinger ........................ 324/66 |
| 6,734,658 | B1 | 5/2004 | Bierer |
| 2003/0169029 | A1 | 9/2003 | Piesinger |

* cited by examiner

*Primary Examiner* — Amy He
(74) *Attorney, Agent, or Firm* — Brian M. Dingman; Mirick, O'Connell, DeMallie & Lougee, LLP

(57) ABSTRACT

A system and method for determining the relative phase between current-carrying conductors. A reference unit samples and digitizes a voltage waveform at a reference location and transmits the digitized voltage waveform. A field sampling unit is placed on or directly adjacent a field conductor at a field location and transmits a signal representative of the voltage waveform of the field conductor. A field unit receives and digitizes the waveform received from the field sampling unit, receives the digitized voltage waveform from the reference unit, and compares the digitized field waveform and the digitized reference waveform. Also provided are methods for commissioning the phase identification system and calibrating the reference unit.

6 Claims, 7 Drawing Sheets

PHASE IDENTIFICATION SYSTEMS AND METHODS

CROSS-REFERENCE TO RELATED APPLICATIONS

This application is a continuation-in-part of, and claims priority from, U.S. patent application Ser. No. 11/281,959 entitled "Phase Identification System and Method," filed Nov. 17, 2005, now U.S. Pat. No. 7,372,246 to Harold I. Marsden and Aaron Coolidge, the entire content of which is incorporated by reference herein, and which is based on and claims the benefit of priority of U.S. Provisional Patent Application Ser. No. 60/629,025 filed on Nov. 18, 2004, the disclosure of which is expressly incorporated by reference herein in its entirety.

FIELD OF THE INVENTION

This invention relates to the identification of the phase of a conductor in a power delivery system. More specifically, the invention relates to the identification of the phase of a conductor in commercial, industrial, residential and nautical power delivery systems, including power generation systems, power transmission systems, and power distribution systems.

BACKGROUND OF THE INVENTION

Electricians and utility crews often need to know the phase of a conductor of a power distribution system. Most systems designed to determine this are not reliable. Further, many must be calibrated before each use, or at each field location, making them less useful, and more difficult to use. There is thus the need for such a system that is quick and easy to use, requires little training, and requires only a single calibration that may be used across a broad geographic area.

SUMMARY OF THE INVENTION

It is therefore an object of this invention to provide a system for determining the phase of a field conductor in a power distribution system in which all the field crew needs to do is to place a sensing unit against the conductor, and the phase is then displayed.

It is a further object of this invention to provide such a system with the ability to accomplish full-cycle waveform analysis and comparison.

It is a further object of this invention to provide such a system that is more reliable and faster than other phase-determining systems.

This invention features a system and method for determining the phase between current-carrying conductors. A reference unit samples and digitizes a voltage waveform at a reference location and transmits the digitized voltage waveform. A field sampling unit is placed on or directly adjacent a field conductor at a field location and transmits a signal representative of the voltage waveform of the field conductor. A field unit receives and digitizes the waveform received from the field sampling unit, and receives the digitized voltage waveform from the reference unit, and compares the digitized field waveform and the digitized reference waveform to determine the phase of the field conductor relative to the reference.

The reference unit and the field unit preferably begin digitizing the waveforms at times that are known relative to one another; preferably at essentially the same time. The timing of the digitization may be based on a time mark. The reference unit and the field unit may each further include a time mark receiver. The time mark receiver may comprise a GPS receiver. The time marks may be internally generated; the reference unit and the field unit may each include a time mark generator. In that case, one time mark generator may be the master, and one the slave. The slave may be synchronized to the master by temporarily connecting them.

The field sampling unit may comprise two conductive sensor elements that sense nearby voltage waveforms. The conductive sensor elements may comprise capacitive pickups, and may each have an output. The system may then further include an electronic circuit for determining the difference between the two outputs. The electronic circuit may comprise a differential amplifier having an output. The system may further include a variable gain amplifier that accepts the output of the differential amplifier. This electronic circuit is preferably located in the field sampling unit.

One of the sensor elements preferably comprises a cylinder, and the second a cylinder with at least one closed end. The closed end of the second sensor element is typically placed on or close to the field conductor so that it capacitively couples to the conductor. This sensing element works best when the generally planar face of the closed end is held generally parallel to the field conductor.

Also featured in the invention is a system and method for comparing voltage waveforms, comprising a reference unit that samples a voltage waveform at a reference location and transmits a representation of the sampled voltage waveform, and a field unit that samples a voltage waveform at a field location that is remote from the reference location, receives the representation from the reference unit, and displays both the field waveform and the reference waveform.

In preferred embodiments, the invention features a system for determining the phase of a current-carrying conductor relative to a reference phase. The system comprises a reference unit positioned at a first location and calibrated relative to a second location to determine a calibration offset, where the reference unit samples and digitizes a voltage waveform at a reference location, applies the calibration offset to the samples, and transmits the digitized voltage waveform. The system further comprises a field sampling unit that, when placed on or directly adjacent a field conductor at a field location, transmits a signal representative of the voltage waveform of the field conductor. In addition, the system comprises a field unit that receives and digitizes the waveform received from the field sampling unit, and receives the digitized voltage waveform from the reference unit. The field unit compares the digitized field waveform and the digitized reference waveform to determine the phase of the field conductor relative to the reference.

In additional embodiments, the invention features a system for determining the phase of an alternating current having a periodic waveform and carried by a field conductor relative to an alternating current having a periodic waveform and carried by a reference conductor. The system comprises a reference unit positioned at a first location and calibrated relative to a second location to determine a calibration offset, where the reference unit samples the reference conductor voltage at a plurality of temporally spaced intervals, applies the calibration offset to the plurality of voltage samples, digitizes the plurality of voltage samples, and transmits the plurality of digitized reference conductor voltage samples. The system further comprises a field sampling unit that, when placed on or directly adjacent the field conductor at a field location, transmits a signal representative of a field conductor voltage, where the field sampling unit comprises a first conductive sensor element proximate a first end of the field sampling unit for sensing one or more voltages from one or more nearby conductors, the first conductive sensor element comprising a cylinder and a first output, a second conductive sensor element proximate a distal end of the field sampling unit for sensing one or more voltages from one or more nearby conductors, the second conductive sensor element comprising a cylinder and a second output and having at least one closed end with a generally planar face, where the closed end of the second conductive sensor element acts as a capacitive pickup when placed on or proximate to and generally parallel to the field conductor; and an electronic circuit for measuring the difference between the first output and the second output. The voltages of the one or more nearby conductors other than the field conductor are sensed approximately equally by the first and second conductive sensor elements and the differential measurement is representative of the voltage of the field conductor. In addition, the system comprises a field unit that receives the voltage signal from the field sampling unit, samples the field conductor voltage at a plurality of temporally spaced intervals and digitizes the plurality of voltage samples, receives the plurality of digitized reference conductor voltage samples, and compares the plurality of digitized field conductor voltage samples and the plurality of digitized reference conductor voltage samples to determine the phase of the alternating current carried by the field conductor relative to the alternating current carried by the reference conductor.

Further, the field unit may be positioned at a third location, and the third location may be approximately within 50 radial miles of the second location. In addition, the reference unit may be calibrated relative to a phase determined by the field unit when the field unit is positioned at a second location.

In additional embodiments, the invention features a method for determining the phase of a current-carrying conductor relative to a reference phase. The method comprises the steps of sampling and digitizing a voltage waveform at a reference location; applying a calibration offset to the reference-location waveform; sampling and transmitting a signal representative of a voltage waveform at another, field location; receiving and digitizing the field-location waveform; and comparing the digitized field waveform and the digitized reference waveform to determine the phase of the field conductor relative to the reference.

BRIEF DESCRIPTION OF THE DRAWINGS

Other objects, features and advantages will occur to those skilled in the art from the following description of the preferred embodiments, and the accompanying drawings, in which.

DETAILED DESCRIPTION OF THE PREFERRED EMBODIMENTS OF THE INVENTION

The invention comprises a system and method for determining the relative phase of a conductor in a multiple-phase (typically three phase) power distribution network. There are three basic units in the inventive phase identification system: the reference unit, the hot stick unit, and the field unit. These are explained below and shown in the enclosed drawings. The invention also provides methods for commissioning the phase identification system and calibrating the reference unit.

Reference Unit

Figure 1:
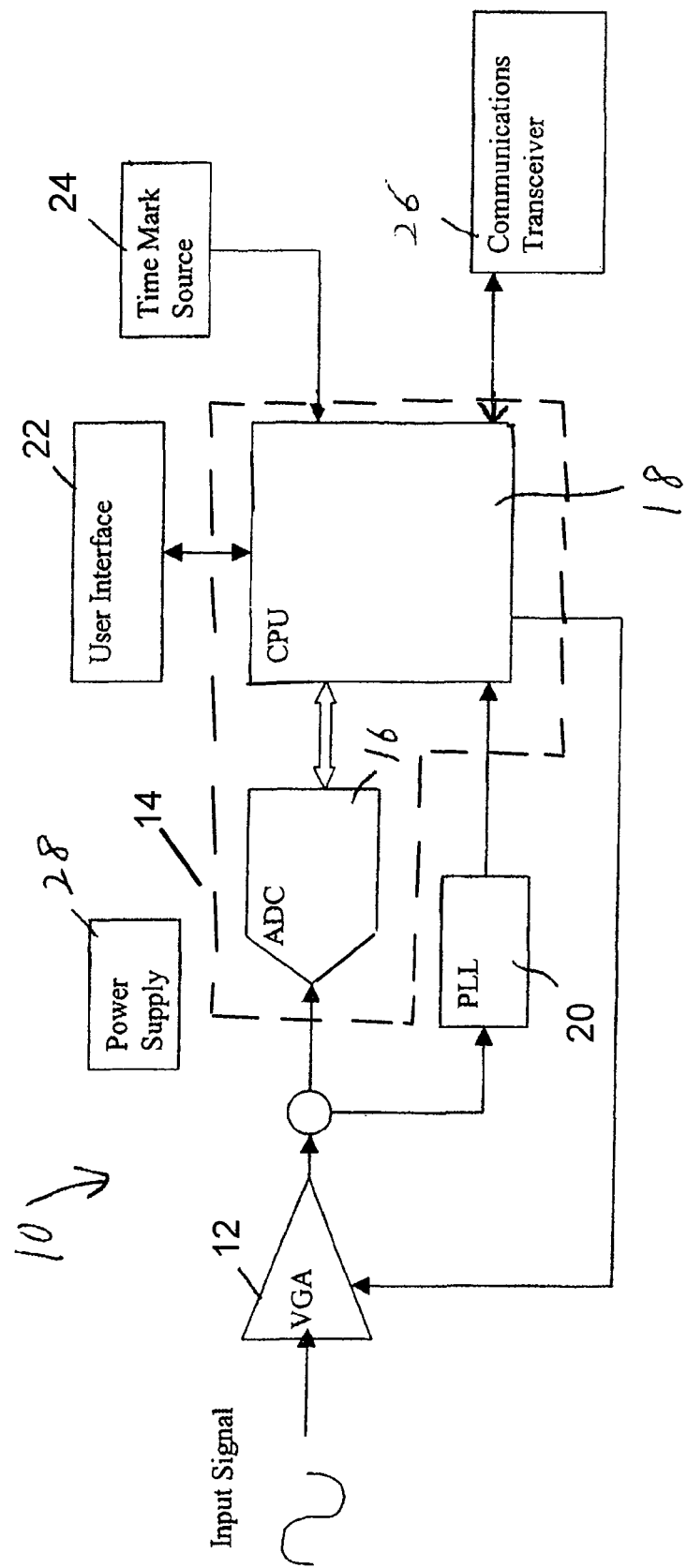
FIG. 1 is a schematic block diagram of the Reference Unit of the preferred embodiment of the invention.

Reference unit 10, FIG. 1, samples the voltage of an ac power line (input signal) that is connected to variable gain amplifier 12 through appropriate isolation circuitry (not shown). The input signal is usually but not necessarily of a known phase; in a three-phase network either phase A, B, or C (sometimes referred to as Phase 1, 2, or 3). A time mark receiver, or internal or external timing generator (generically termed time mark source 24), is used to start a sampling cycle. A sample cycle typically proceeds for the time period of one complete waveform, which in a 60 Hz system equates to 1/60 second. During the sampling cycle the voltage waveform of a conductor is sampled by CPU 18 via an Analog to Digital Converter (ADC) 16 at a number of equally-temporally-spaced intervals; 360 equally spaced samples are collected in the preferred embodiment. The CPU and ADC can be parts of a single CPU component 14 of a type well-known in the art, as long as the ADC has a sufficient conversion rate. 360 sample points were chosen in the preferred embodiment to simplify the mathematics required, although fewer samples can be taken as long as the measurement uncertainty is less than 60°.

A phase locked loop (PLL) 20 is used to ensure the exact number of samples per cycle of the input waveform; the phase locked loop may be either a hardware component or a software component. To maintain maximum signal-to-noise ratio into the ADC, an optional Variable Gain Amplifier (VGA) 12 may be used as shown. User-interface 22 allows the user to control and/or monitor the operation of Reference Unit 10, and can also be used to display the reference and sample waveforms, as shown below. The set of nominally 360 sampled values are made available to one or more Field Units via communications transceiver 26, using any available communications medium, for example radio or the cellular telephone network. In the preferred embodiment, the units are enabled to accomplish both types of communication, and the operator can use the interface to switch between the two. Successful communication can be indicated to the operator on the display, as described in more detail below.

Hot Stick (Field Sampling) Unit

Figure 2:
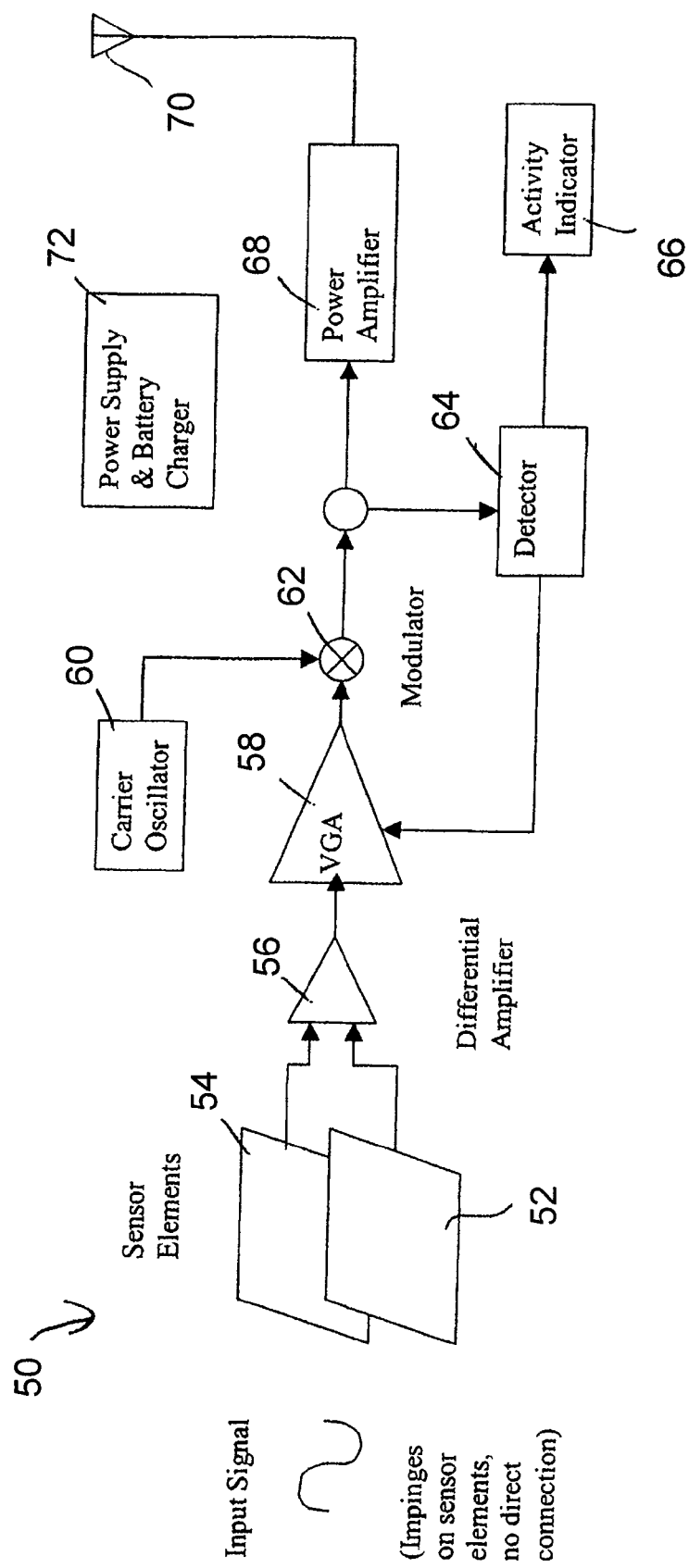
FIG. 2 is a schematic block diagram of the Field Sampling Unit of the preferred embodiment of the invention.

Hot stick unit 50, FIG. 2, includes sensor elements 52 and 54. The active (sensitive) surface of the hot stick unit is held against or adjacent to a conductor to be measured by a field operator at a location remote from the reference unit. The hot stick unit transmits to a field unit over antenna 70 an analog representation of the voltage signal applied to its sensitive input. The hot stick unit may be used in systems with voltages from 120 VAC up to 69 KVAC; higher voltages may be sampled with additional protection from corona effects. Unwanted signals are automatically cancelled by the design of the sensing elements of the hot stick unit. This minimizes the effect of nearby voltage sources on any measurements made.

The input signal from sensing elements 52 and 54 is passed through a Variable Gain Amplifier (VGA) 56 to maintain maximum signal-to-noise ratio. This result is modulated with a carrier frequency using oscillator 60 and modulator 62, amplified in power amplifier 68, and applied to antenna 70 for transmission to a field unit, which is typically located in a truck close to the location of the hot stick unit. The signal applied to the power amplifier is also applied to detector 64, to adjust the gain of VGA 58 in order to maximize the efficiency of the transmitting circuit by ensuring sufficient modulation for efficient transmission, while preventing transmitter overload. There is a visual indication to the operator that a signal is being transmitted via an activity indicator 66, which may be an LED that is visible to the operator.

Hot Stick Unit Sensor Elements

The sensor elements 52, 54 of the hot stick unit contribute to the rejection of unwanted signals. They work on the principle of a differential input. Portion 80 is a structural element that carries the remaining components, including the rechargeable battery power source 72. The hot stick unit can be mounted on the end of a long non-conductive (e.g. composite) pole (not shown) that is held by the operator to place the active structure against or close to the conductor being measured.

Figure 3:
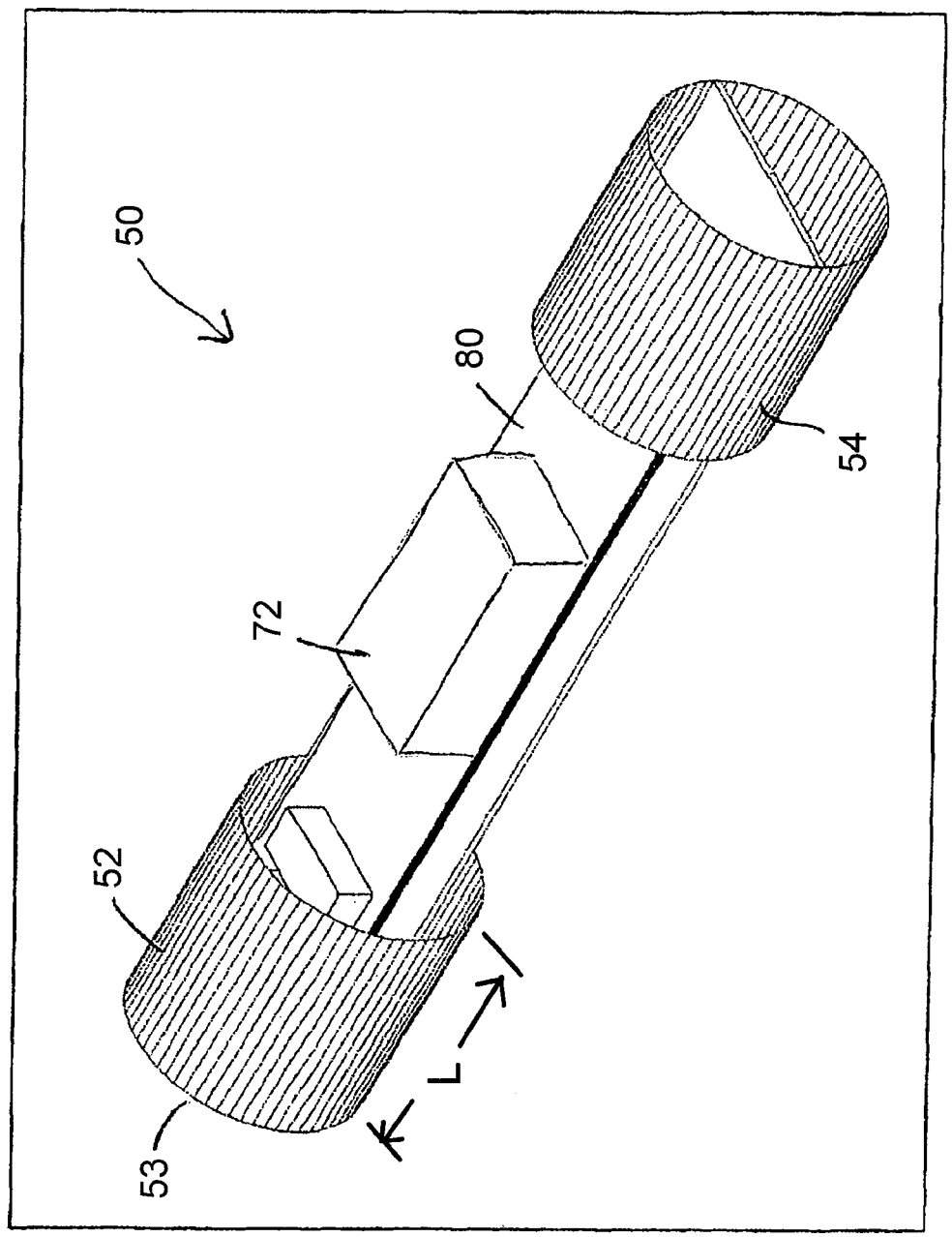
FIG. 3 is a partial, schematic diagram of the active portions of the Field Sampling Unit of FIG. 2.

The sensor elements are preferably both cylindrical conductors, as shown in FIG. 3. One sensor element 54 (spaced from the active sensing end) is a cylinder that is open on both ends. The other sensor element 52 is a cylinder with the end facing element 54 open, the other end is closed by a generally planar circular face 53. Open faces make assembly easier, but are not required for the functionality of the elements. Elements 52 and 54 are made of conductive material (for example 0.002 inch thick copper). In the described embodiment, the cylinders have a diameter of about two inches and a length of about 1.5 inches. These two elements are spaced apart, and can be held inside of a non-conducting tube, not shown.

It has been found that the trade-off of sensitivity and effectiveness is best achieved if the two elements have the same length, L, and are separated by a distance that is about 1.5-2 L, though this is not a critical dimension; the length acts to assist the differential effect of the two separated pickup plates rejecting unwanted signals. The distance between the elements can be selected to achieve a desired differential effect.

The closed planar end 53 of one element 52 is the "active" surface, which when placed near an electric field acts as a capacitive pickup. The effect of the equal area cylinders perpendicular to the conductor to be measured is to cause unwanted signals (e.g., caused by another nearby conductor) to appear approximately equally on both cylinders, thus allowing the unwanted signals to be cancelled with a differential measurement between the two cylinders. The cylindrical shape is also advantageous, as the planar projection does not change in area with rotation of the cylinder about its longitudinal axis, but the measurement would work for other possible shapes such as rectangular For best rejection of unwanted signals, the hot stick unit should be applied at a right angle to the desired conductor, with the active end 53 either touching or adjacent to the conductor being measured, with the face of the closed end of the cylinder essentially parallel to the conductor.

Field Unit

Figure 4:
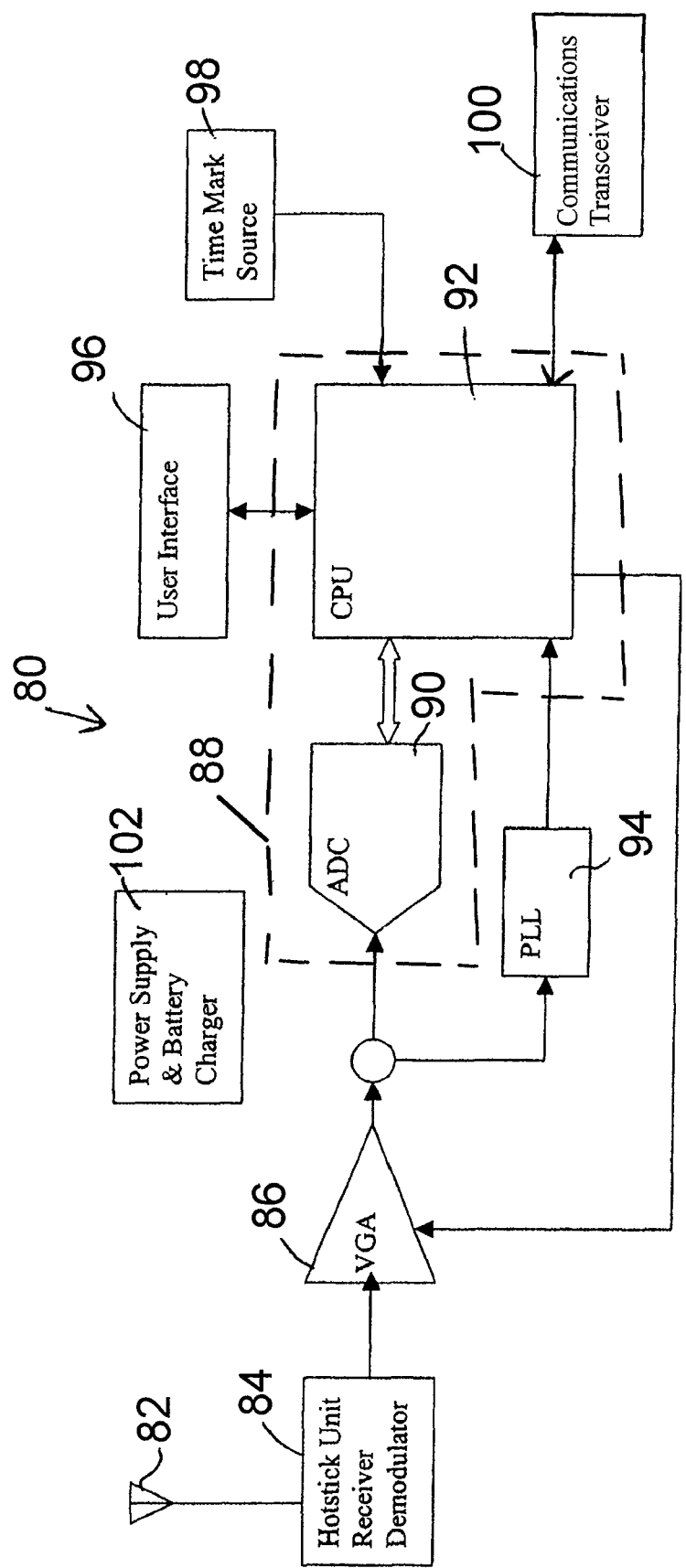
FIG. 4 is a schematic block diagram of the Field Unit of the preferred embodiment of the invention.

Field Unit 80, FIG. 4, has antenna 82 that receives the analog representation of an unknown phased voltage from the hot stick unit. This signal is demodulated, 84, and applied to a Variable Gain Amplifier (VGA) 86. A time mark receiver or generator 98 synchronized (e.g. using GPS) with the Reference Unit is used to start a sampling cycle. This ensures that both the Reference Unit and the Field Unit are sampling at the same time. In order to account for signal propagation delays that might affect the results, for example caused by upstream capacitors or other equipment, the field unit may be configured to allow the operator to input a delay into the start of the field waveform measurement through user interface 98 (e.g. with push buttons or other manual input means).

Also, there is a propagation delay of about one nanosecond per foot of conductor. If the field conductor is located more than about 50 miles or so from the calibration location, this delay can change the phase determination result. In such cases, the delay can be accounted for. One manner in which this can be done is to determine the distance between the units (e.g. using the GPS that is used to receive the time mark in the preferred embodiment), and delay measurement by the field unit for the amount of time equal to the approximate propagation delay for this distance. Another possibility would be for the operator to determine or estimate distance and thus the propagation delay, and use the manual input feature described above to account for this.

A third method for minimizing the effects of propagation delay is to use the phase identification system to measure known phases at physically disparate locations from which the actual propagation delays to that location may be determined. The series of locations are selected to cover the geographic territory that is of interest. When determining the phase of unknown conductors the geographically closest location where the propagation delay has been predetermined is selected either automatically or by a user. Automatic selection is performed using the GPS receiver in the Field Unit to select a predetermined propagation delay from a matrix of geographic locations and associated propagation delays. Alternatively, a user may select a geographic location via the user interface, which in turn specifies a propagation delay.

The amplified signal is sampled by the Central Processing Unit (CPU) 92 via ADC 90 at 360 equally spaced points. 360 points were chosen to simplify the mathematics required, although other values may be used. CPU 92 and ADC 90 can be resident on single CPU component 88. A phase locked loop (PLL) 94 is used to ensure the exact number of samples per cycle of the input waveform; the phase locked loop may be either a hardware component or a software component. To maintain maximum signal-to-noise ratio into ADC 90, the gain of VGA 86 is varied under control of CPU 92. Rechargeable power supply 102 supplies power to all of the components.

After the sampling cycle of nominally 360 samples has been completed, the samples are compared in CPU 92 to the corresponding set of nominally 360 samples that was obtained from the Reference Unit via communications transceiver 100. The number of samples in each set does not need to be the same, but keeping the same number simplifies the mathematics. The digital value of each sample in the "field" set is compared to that of its corresponding sample in the "reference" set. If a majority of matching (same amplitude when normalized) values is not found, one of the two sets is shifted one sample in a circular manner, and the comparison test is repeated.

Figure 5A:
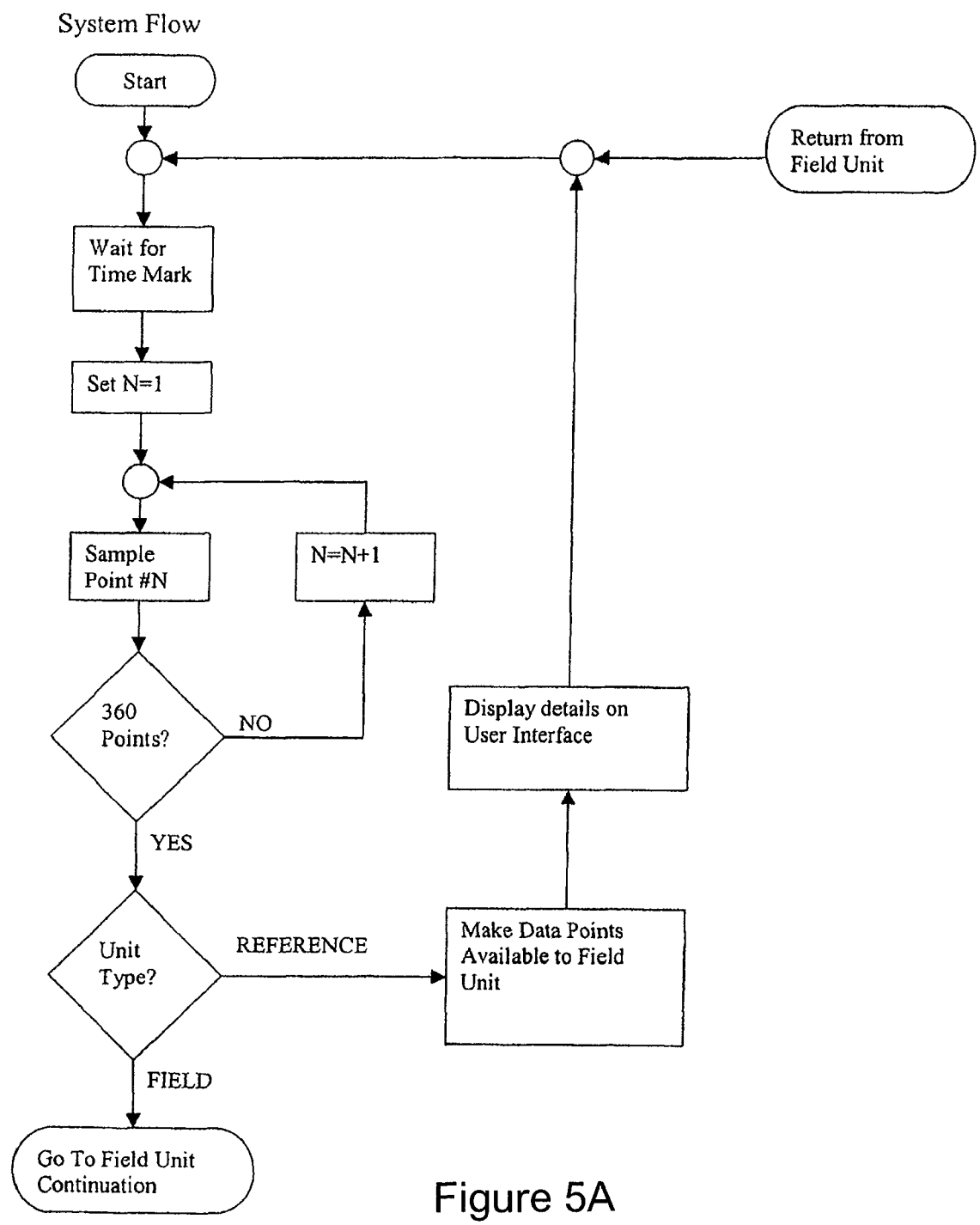
FIGS. 5A and 5B together are a flow chart of the operation of the preferred embodiment of the invention.
Figure 5B:
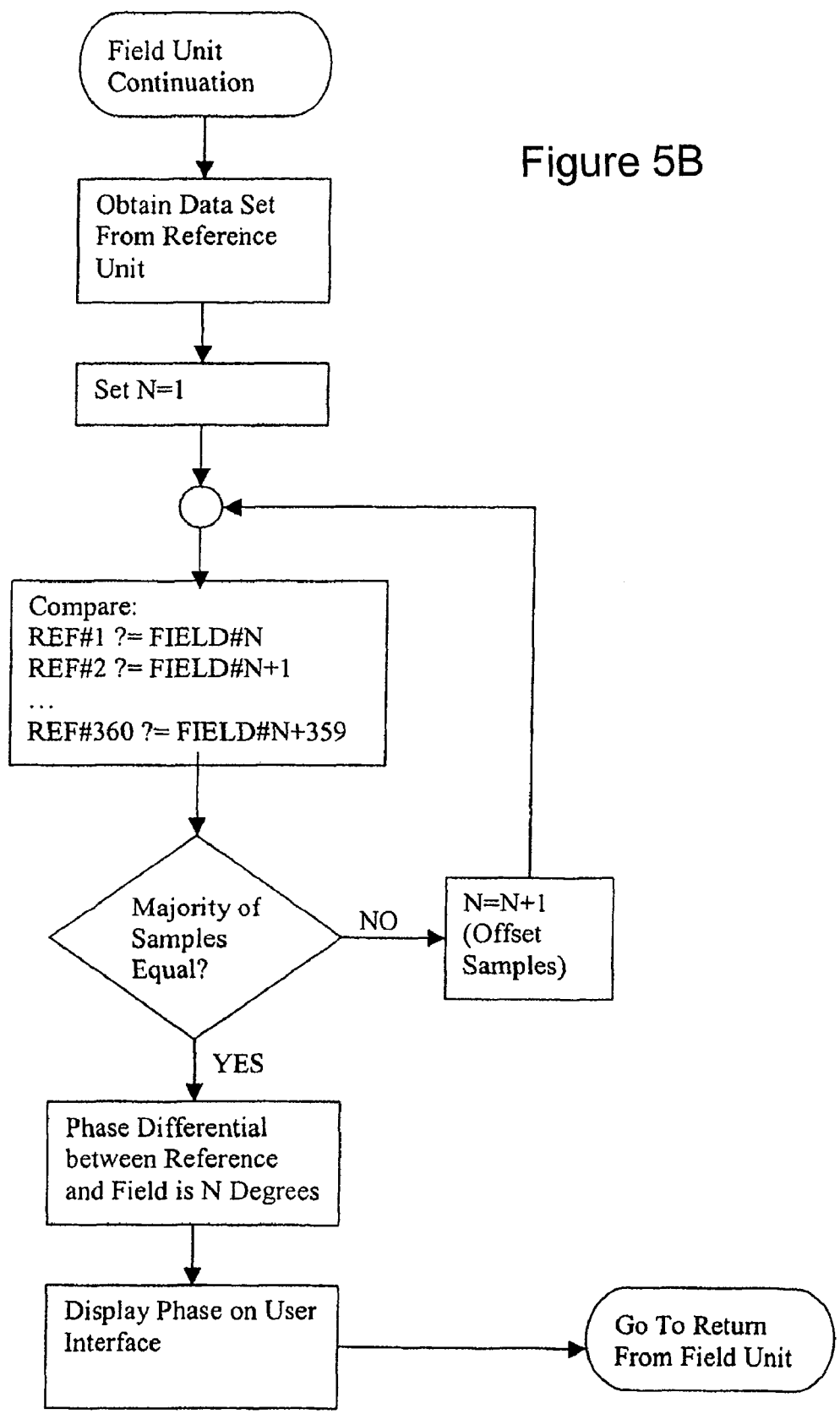

When a majority of samples are found to match, the phase difference between the two sample sets is computed from the number of shifts required to generate the match. In the case of 360 samples in the two sets, the phase difference in degrees is simply the number of shifts required. If the number of samples were not equal, one set would be interpolated to change its number to match the other set before the comparison is made. The results are shown on user interface 96 (see FIG. 6) and may be transmitted back to the reference unit via communications transceiver 100. See the attached system flow chart, FIGS. 5A and 5B, for the preferred operation of the inventive system.

Figure 6:
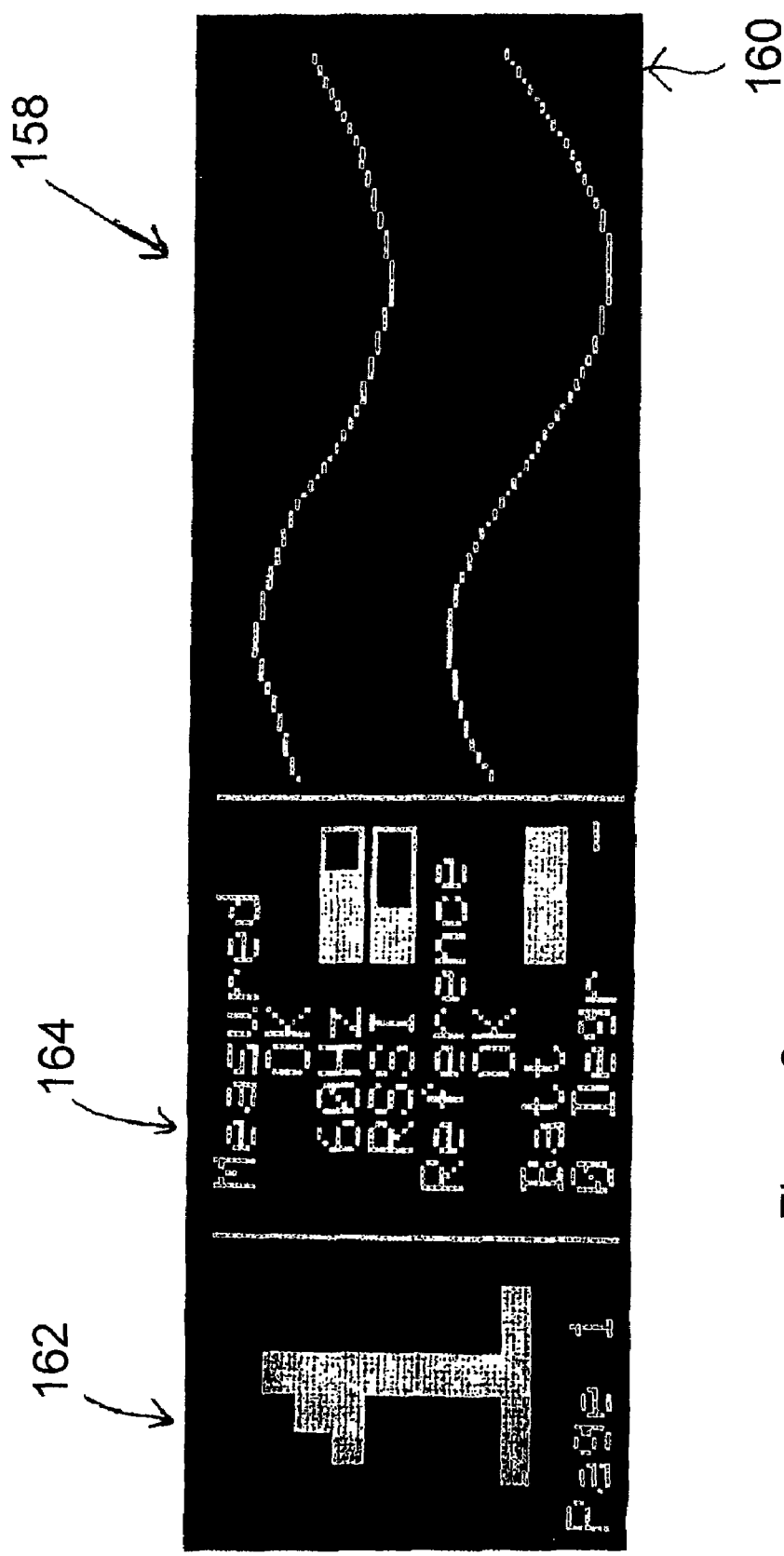
FIG. 6 is a view of one form of the compared waveform display of the invention.

One version of the display of a field unit is shown in FIG. 6. Display 158 has first portion 160 that displays the two measured waveforms. The waveforms can be displayed one above the other as shown, or one on top of the other so that direct comparison can be easily seen. When this ability is provided, the operator selects the display configuration using the operator interface. The waveforms are properly scaled for display purposes. This allows the operator to visually confirm whether the waveforms are in-phase (as shown in the drawing), or out of phase. In normal circumstances, any phase shift will be either 120 or 240 degrees. When there is no measurement from either the reference or field unit, the display line is flat. Such a display can also be used for other diagnostic purposes, such as comparing the noise of two waveforms, one measured remotely (the reference) and one locally, with one or both wirelessly transmitted to the display unit, or perhaps for viewing harmonic distortions in waveforms. When the invention is used for such display purposes, the field unit can be directly inputted with a waveform, rather than wirelessly through a hot stick unit.

Second display portion 162 indicates the measured phase of the field conductor, in this case phase "1." When the field unit is not currently measuring phase, such can be indicated with a diagonal line through the phase indicator, in this case the number "1"; the diagonal line (like a glyph) is not shown in the drawing.

Third display portion 164 is used to provide additional diagnostic and other information to the user, such as whether the current measurement was successful or not, the frequency and amplitude of the measured voltage (if this display is "0", then there is no measurement being made by the hot stick unit), whether the reference measurement was successful, the charge state of the on-board battery (in this case, fully charged as indicated by the full bar display), and the phase angle difference between the reference and field conductors (in this case zero degrees, meaning that the two signals are in phase).

Time Mark Receiver or Generator

As described above, the Reference/Field Unit synchronization can be achieved using external time marks, or internally-generated timing. The time mark preferably comes from a receiver such as a GPS receiver, a GLONAS receiver, a WWV time receiver, or another satellite or terrestrial broadcast system. The time marks could come from two different sources as long as any offset between them was known a priori. The time mark may also be generated internally via an accurate crystal oscillator, an atomic clock, or an atomic frequency standard, for example. If the time mark were to be generated as opposed to received, a mechanism for performing a timing synchronization between the reference unit and any and all field units would likely be required. This could be accomplished by connecting the units together with a wire, not shown in the drawings. One time mark generator designated as the master (typically the reference unit generator) would then force the other slave generator(s) into synchronization. Synchronization would have to be repeated at appropriate intervals, for example daily. This could be done, for example, at a base station before utility crews were sent out for the day.

System Commissioning

In a preferred embodiment, the phase identification system may be commissioned by installing the Reference Unit at a permanent physical location and calibrating the Reference Unit relative to a second physical location, the second physical location known as the point of calibration.

Specifically, after the Reference Unit is installed at a permanent location, the Field Unit is brought to a second physical location, the point of calibration, where at least one phase of a conductor in a multiple-phase power distribution network or power grid is known and is accurately labeled. The Field Unit is then used to determine the phase of the conductor using the methods described above. If the Field Unit does not correctly determine the phase of the conductor, a calibration offset is applied to the Reference Unit. The calibration offset is adjusted until the Field Unit correctly determines the phase of the conductor, and stored at the Reference Unit. The calibration offset so derived is available for use by any and all of the Field Units, and therefore needs only to be performed once. The calibration offset is used to pre-shift the waveform sampled by the Reference Unit to provide an overall system calibration, i.e., for a 360 sample waveform, each sample is shifted by an amount equal to the required offset in degrees. The pre-shifted sample set is then provided to the Field Units.

The propagation of the 60 Hz waveforms used in the power distribution networks allows this calibration offset to be used at distances of up to approximately 50 miles from the point of calibration, assuming the Reference Unit is connected to the same power distribution network as the point of calibration, and on the same power distribution network as the phase or phases to be determined. For example, because Maine and Florida are on the same power distribution network, the Reference Unit may be located in Florida for phase measurements to be taken in Maine, assuming the point of calibration is within a radius of approximately 50 miles of the location of the phase measurements, and the Reference Unit was calibrated using the same power distribution network as the location of the phase measurements. In contrast, the Reference Unit may not be located on the island of Bermuda for phase measurements to be taken in Maine, because Maine and Bermuda are not on the same power distribution network.

In another preferred embodiment, one Reference Unit may be shared by a plurality of Field Units. For example, a utility having a power distribution network that encompasses a territory 50 miles wide by 300 miles long to may need only a single Reference Unit. Alternatively, multiple utilities may share a single Reference Unit.

This embodiment of the invention employs the GPS location capability in the Field Unit to create a matrix of calibration offsets during system commissioning, rather than a single calibration offset. As above, each calibration offset is determined by measuring the phase of a conductor at a location where the phase is known and correctly labeled. Each calibration offset is then associated with the geographic location provided by the GPS in the Field Unit to create a matrix of known phase points. The matrix of known phase points is preferably stored in the Reference Unit. Alternatively, the matrix of known phase points may be stored in the Field Unit, and would need to be loaded into each new Field Unit that is brought into use. In a preferred embodiment, the geographic locations of the known phase points would be no more than approximately 50 miles apart.

In operation, to measure a phase at a location where the phase is unknown, the Field Unit first transmits its geographic location, as determined by the GPS in the Field Unit, to the Reference Unit. The Reference Unit then determines the closest known phase point from the matrix of known phase points. The data stream from the Reference Unit to the Field Unit is then tailored to the geographic location of the Field Unit by pre-shifting the waveform samples a second time so as to offset the propagation delay in the manner described above. The calibration offset is applied before the sample set is transmitted to the Field Unit, causing the Reference Unit to appear to be physically located at the selected known phase point. In this manner, a single Reference Unit may appear to be located simultaneously at many points.

If a single Reference Unit is shared by multiple utilities, each utility may have its own unique identifier. The utility's unique identifier may be provided by the Field Unit when the Field Unit signs on, and would be used to uniquely identify the matrix of known phase points for the utility, both at system commissioning and during regular use. The sign-on procedure is used to ensure that a particular Field Unit is permitted to access sampled waveforms provided by the Reference Unit, and further ensures that the Field Unit is operated within its area of calibration. The sign-on process takes place when the communications link between a Field Unit and a Reference Unit is established, and requires that the Field Unit send identifying information to the Reference Unit. In a preferred embodiment, the Field Unit will send its serial number and geographic location.

Although specific features of the invention are shown in some drawings and not others, this is for convenience only as the features may be combined in accordance with the invention. Other embodiments will occur to those skilled in the art and are within the following claims.

What is claimed is:

1. A system for determining the phase of a current-carrying conductor relative to a reference phase, comprising:
    a reference unit positioned at a first location and calibrated relative to a second location to determine a calibration offset, where the reference unit samples and digitizes a voltage waveform at a reference location, applies the calibration offset to the samples, and transmits the digitized voltage waveform;
    a field sampling unit that, when placed on or directly adjacent a field conductor at a field location, transmits a signal representative of the voltage waveform of the field conductor; and
    a field unit that receives and digitizes the waveform received from the field sampling unit, and receives the digitized voltage waveform from the reference unit, and compares the digitized field waveform and the digitized reference waveform to determine the phase of the field conductor relative to the reference.

2. A method for determining the phase of a current-carrying conductor relative to a reference phase, comprising:
    sampling and digitizing a voltage waveform at a reference location;
    applying a calibration offset to the reference-location waveform;
    sampling and transmitting a signal representative of a voltage waveform at another, field location;
    receiving and digitizing the field-location waveform; and
    comparing the digitized field waveform and the digitized reference waveform to determine the phase of the field conductor relative to the reference.

3. A system for determining the phase of an alternating current having a periodic waveform and carried by a field conductor relative to an alternating current having a periodic waveform and carried by a reference conductor, comprising:
    a reference unit positioned at a first location and calibrated relative to a second location to determine a calibration offset, where the reference unit samples the reference conductor voltage at a plurality of temporally spaced intervals, applies the calibration offset to the plurality of voltage samples, digitizes the plurality of voltage samples, and transmits the plurality of digitized reference conductor voltage samples;
    a field sampling unit that, when placed on or directly adjacent the field conductor at a field location, transmits a signal representative of a field conductor voltage,
    wherein the field sampling unit comprises a first conductive sensor element proximate a first end of the field sampling unit for sensing one or more voltages from one or more nearby conductors, the first conductive sensor element comprising a cylinder and a first output, a second conductive sensor element proximate a distal end of the field sampling unit for sensing one or more voltages from one or more nearby conductors, the second conductive sensor element comprising a cylinder and a second output and having at least one closed end with a generally planar face, where the closed end of the second conductive sensor element acts as a capacitive pickup when placed on or proximate to and generally parallel to the field conductor; and an electronic circuit for measuring the difference between the first output and the second output, and
    wherein the voltages of the one or more nearby conductors other than the field conductor are sensed approximately equally by the first and second conductive sensor elements and the differential measurement is representative of the voltage of the field conductor; and
    a field unit that receives the voltage signal from the field sampling unit, samples the field conductor voltage at a plurality of temporally spaced intervals and digitizes the plurality of voltage samples, receives the plurality of digitized reference conductor voltage samples, and compares the plurality of digitized field conductor voltage samples and the plurality of digitized reference conductor voltage samples to determine the phase of the alternating current carried by the field conductor relative to the alternating current carried by the reference conductor.

4. The system of claim 3, where the field unit is positioned at a third location.

5. The system of claim 4, where the third location is approximately within 50 radial miles of the second location.

6. The system of claim 5, where the reference unit is calibrated relative to a phase determined by the field unit when the field unit is positioned at the second location.

* * * * *